(12) United States Patent
Zhu et al.

(10) Patent No.: US 12,222,305 B1
(45) Date of Patent: Feb. 11, 2025

(54) **ELECTRICAL IMPEDANCE MONITORING DEVICE, SYSTEM AND METHOD FOR LOCOMOTION BEHAVIORS OF *CAENORHABDITIS ELEGANS***

(71) Applicant: SOUTHEAST UNIVERSITY, Wuxi (CN)

(72) Inventors: Zhen Zhu, Wuxi (CN); Song Yu, Wuxi (CN); Jianwei Ouyang, Wuxi (CN)

(73) Assignee: SOUTHEAST UNIVERSITY, Wuxi (CN)

( * ) Notice: Subject to any disclaimer, the term of this patent is extended or adjusted under 35 U.S.C. 154(b) by 0 days.

(21) Appl. No.: 18/727,344

(22) PCT Filed: Feb. 6, 2024

(86) PCT No.: PCT/CN2024/076198
§ 371 (c)(1),
(2) Date: Jul. 9, 2024

(87) PCT Pub. No.: WO2024/193252
PCT Pub. Date: Sep. 26, 2024

(30) Foreign Application Priority Data

Mar. 17, 2023 (CN) .......................... 202310257166.0

(51) Int. Cl.
*G01N 27/02* (2006.01)
*B01L 3/00* (2006.01)
*H05K 1/18* (2006.01)

(52) U.S. Cl.
CPC ...... *G01N 27/028* (2013.01); *B01L 3/502715* (2013.01); *H05K 1/184* (2013.01);
(Continued)

(58) Field of Classification Search
CPC ............. G01N 27/028; B01L 3/502715; B01L 2400/06; H05K 1/184; H05K 2201/10151;
(Continued)

(56) References Cited

U.S. PATENT DOCUMENTS

2018/0161771 A1* 6/2018 Vanapalli ............... G01N 33/48
2018/0364143 A1* 12/2018 Al Ahmad ............. G01N 27/02
(Continued)

FOREIGN PATENT DOCUMENTS

| CN | 107942083 A | 4/2018 |
| CN | 111735852 A | 10/2020 |

(Continued)

*Primary Examiner* — Raul J Rios Russo
(74) *Attorney, Agent, or Firm* — Bayramoglu Law Offices LLC

(57) ABSTRACT

Disclosed are an electrical impedance monitoring device, system and method for locomotion behaviors of *C. elegans*. A microfluidic channel layer and a gas channel layer form a double-layer structure by bonding, and the double-layer structure is tightly fixed to a circuit board with nylon screws. An electrode array configured as a concentric circle structure is arranged on the circuit board and used for realizing EIT monitoring of *C. elegans*. The microfluidic channel layer comprises a culture and monitoring chamber and a *C. elegans* transition channel and used for long-term culture and cyclic monitoring of *C. elegans*. The gas channel layer comprises a gas inlet and a gas channel and used for applying a gas pressure to squeeze an upper wall of the microfluidic channel layer to form a membrane valve to close the microfluidic channel layer.

9 Claims, 4 Drawing Sheets

(52) U.S. Cl.
CPC ............... *B01L 2400/06* (2013.01); *H05K 2201/10151* (2013.01); *H05K 2201/10409* (2013.01); *H05K 2201/10909* (2013.01); *H05K 2201/10977* (2013.01)

(58) Field of Classification Search
CPC .......... H05K 2201/10409; H05K 2201/10909; H05K 2201/10977
USPC ........................................................ 324/649
See application file for complete search history.

(56) References Cited

U.S. PATENT DOCUMENTS

2021/0071122 A1    3/2021    Zhu et al.
2022/0291211 A1*    9/2022    Kim ................... G01N 33/5438

FOREIGN PATENT DOCUMENTS

| | | |
|---|---|---|
| CN | 113522383 A | 10/2021 |
| CN | 116269305 A | 6/2023 |

* cited by examiner

ELECTRICAL IMPEDANCE MONITORING DEVICE, SYSTEM AND METHOD FOR LOCOMOTION BEHAVIORS OF *CAENORHABDITIS ELEGANS*

CROSS REFERENCE TO THE RELATED APPLICATIONS

This application is the national phase entry of International Application No. PCT/CN2024/076198, filed on Feb. 6, 2024, which is based upon and claims priority to Chinese Patent Application No. 202310257166.0, filed on Mar. 17, 2023, the entire contents of which are incorporated herein by reference.

TECHNICAL FIELD

The invention belongs to the field of electrical impedance detection, and particularly relates to an electrical impedance monitoring device, system and method for locomotion behaviors of *Caenorhabditis elegans* (*C. elegans*).

BACKGROUND

Electrical Impedance Tomography (EIT) is a non-invasive and non-optical imaging method, which reconstructs a conductivity distribution image of an object to be detected according to an EIT scanning result obtained by measuring the detection voltage of electrodes, other than two adjacent ones in which an exciting current is injected, arranged around the object to be detected. Initially, the EIT scanning technique is widely applied to the field of medical treatment and health to realize scan imaging of human organs such as lungs. In recent years, with the deepening of research, more and more researchers start to explore EIT in smaller scales to monitor the change of conductivity of tiny biological tissues such as cells.

*C. elegans*, as a common model organism, is widely applied to the study of various life sciences because of it is simple in structure, easy to culture and short in lifecycle. Main research platforms for *C. elegans* include agar plates and microfluidic chips, wherein the microfluidic chip is gradually preferred by researchers because it is easy to operate and has a simplex background environment. For studying locomotion behaviors of *C. elegans*, the optical imaging method is commonly used to observe *C. elegans* with a high-precision microscope and extract locomotion behavior parameters of the *C. elegans* by means of a neural network algorithm. However, the high-precision microscope has a complex structure, a high cost and a large amount of image data, making it difficult to realize real-time monitoring; and related study shows that visible light has an influence on the life of *C. elegans*, so monitoring in a natural growing environment of the *C. elegans* cannot be realized by optical imaging.

SUMMARY

The objective of the invention is to provide an electrical impedance monitoring device, system and method for locomotion behaviors of *C. elegans* to solve the technical problems that existing *C. elegans* detection means are inconvenient to operate and affected by light, thus providing a novel device and method for *C. elegans* imaging and expanding the application of EIT in the field of biological detection.

To solve the above technical problems, the specific technical solution of the invention is as follows:

An electrical impedance monitoring device for locomotion behaviors of *C. elegans* comprises a circuit board, a microfluidic channel layer and a gas channel layer, wherein the microfluidic channel layer and the gas channel layer form a double-layer structure fixed to the circuit board;

the circuit board, as a substrate of the electrical impedance monitoring device, is used for carrying the double-layer structure formed by bonding of the microfluidic channel layer and the gas channel layer; an electrode array is arranged on the circuit board and used for realizing current excitation and electrical impedance monitoring;

the microfluidic channel layer comprises a fluid inlet, a food loading channel inlet, a *C. elegans* loading channel, a culture and monitoring chamber, a *C. elegans* transition channel, a food loading channel, an impurity discharge channel and a fluid outlet, wherein the fluid inlet, the *C. elegans* loading channel, the culture and monitoring chamber, the impurity discharge channel and the fluid outlet are connected in sequence;

the gas channel layer comprises the fluid inlet, the food loading channel inlet, a first gas inlet, a second gas inlet, a third gas inlet, a fourth gas inlet, a first membrane valve, a second membrane valve, a third membrane valve, a fourth membrane valve, a fifth membrane valve, a sixth membrane valve and the fluid outlet; wherein, the first gas inlet, the second gas inlet, the third gas inlet and the fourth gas inlet are used for providing a gas pressure for the first membrane valve, the second membrane valve, the third membrane valve, the fourth membrane valve, the fifth membrane valve and the sixth membrane valve, and when the gas pressure increases, the membrane valves will squeeze an upper wall of the microfluidic channel layer to control the *C. elegans* transition channel to be opened or closed;

the food loading channel is connected to the culture and monitoring chamber and is controlled by the second membrane valve to be opened or closed; the *C. elegans* transition channel is arranged an outlet of the culture and monitoring chamber and returns to the culture and monitoring chamber, and *C. elegans* enters the *C. elegans* transition channel from the culture and monitoring chamber under the control of fluid, the third membrane valve, the fourth membrane valve, the fifth membrane valve and the sixth membrane valve, and then returns to the culture and monitoring chamber.

Further, the microfluidic channel layer and the gas channel layer are made from polydimethylsiloxane by molding and form the double-layer structure by bonding, and the double-layer structure is fixed to the circuit board with nylon screws.

Further, the electrode array comprises 32 gold-plated electrode probes and is electrically connected to a solder pad on a back side of the circuit board by soldering, all the probes extend out of the circuit board by a same height, and a solder pad and solder holes on a front side of the circuit board are filled and sealed with epoxy resin; and the electrode array is configured as a concentric circle structure, 16 electrodes are arranged on each of an inner circle and an outer circle of the electrode array, the electrodes on the outer circle are used for scan imaging of the culture and monitoring chamber, and the electrode on the inner circle is used for scan imaging of a central area of the culture and monitoring chamber.

Further, the culture and monitoring chamber is circular, a center of the culture and monitoring chamber is located above a center of the electrode array, a radius of the culture and monitoring chamber is slightly greater than a radius of the outer circle of the electrode array, and after the electrical impedance monitoring device is installed, the electrode array is located inside the culture and monitoring chamber.

The invention further discloses a system based on the electrical impedance monitoring device for locomotion behaviors of *C. elegans*, comprising a multiplex gating module, an FPGA control module, an electrical impedance detection module, an acquisition and imaging module, an image analysis and processing module and a display module, wherein the multiplex gating module is connected to the electrode array on the circuit board and selects different electrodes as excitation and response electrodes for EIT scanning according to control signals generated by the FPGA control module; the electrical impedance detection module is used for generating an excitation signal for EIT scanning and acquiring a response voltage of the response electrode; the acquisition and imaging module is used for reading a detection result of the electrical impedance detection module and reconstructing an electrical impedance image of *C. elegans* according to the detection result; the image analysis and processing module is used for processing the electrical impedance image of the *C. elegans*, compensating for imaging precision of a central area of the electrical impedance image according to an imaging result of the electrodes on the inner circle of the electrode array and calculating locomotion behavior parameters of the *C. elegans*, including a motion speed and the like; and the display module is used for displaying a calculation result of the image processing module to realize real-time monitoring of locomotion behaviors of the *C. elegans*.

The invention further discloses a method based on the electrical impedance monitoring device for locomotion behaviors of *C. elegans*, comprising the following steps: allowing *C. elegans* to enter the culture and monitoring chamber via the fluid inlet and the *C. elegans* loading channel and enter the *C. elegans* transition channel under the control of the membrane valves; cleaning the culture and monitoring chamber through the fluid inlet and the *C. elegans* loading channel; detecting the *C. elegans* culture and monitoring chamber without *C. elegans* by means of the FPGA control module, the multiplex gating module and the electrical impedance detection module; allowing the *C. elegans* to enter the *C. elegans* culture and monitoring chamber again, and performing EIT scanning repeatedly; recording scanning results by the acquisition and imaging module, and generating electrical impedance images of the *C. elegans* in real time according to the scanning results; and calculating locomotion behavior parameters of the *C. elegans* by the image analysis and processing module according to the continuous electrical impedance images of the *C. elegans*, and performing real-time display by the display module.

The electrical impedance monitoring device, system and method for locomotion behaviors of *C. elegans* provided by the invention have the following advantages:

(1) Different from traditional microimaging methods for *C. elegans*, the electrical impedance monitoring device adopts EIT, thus avoiding the influence of light in the life and other parameters of the *C. elegans* during the imaging process; moreover, the electrode array is designed into a concentric circle structure, such that the problem of poor imaging precision of the center of a region of EIT is solved by means of electrodes on the inner circle;

(2) Electrical impedance images contain a small amount of data and can be further analyzed and process easily, thus realizing real-time analysis and display of locomotion behavior parameters of *C. elegans*;

(3) *C. elegans* are controlled in a microfluidic channel by means of fluid and membrane valves, thus avoiding errors caused by traditional manual control methods;

(4) Gold-plated probes are used as electrodes, such that the contact impedance between the probes and a solution is reduced; moreover, the probes and solder pads and solder holes on the circuit board are filled and sealed with biocompatible epoxy glue to avoid direct contact between biologically toxic substances such as soldering tin and copper and a solution in the *C. elegans* culture chamber, thus guaranteeing the survival of *C. elegans*.

Reference signs: 1, circuit board; 2, microfluidic channel layer; 3, gas channel layer; 4, fluid inlet; 5, food loading channel inlet; 6, first gas inlet; 7, second gas inlet; 8, fluid outlet; 9, third gas inlet; 10, fourth gas inlet; 11, screw hole; 101, electrode array; 201, *C. elegans* loading channel; 202, food loading channel; 203, *C. elegans* transition channel; 204, impurity discharge channel; 205, culture and monitoring chamber; 301, first membrane valve; 302, second membrane valve; 303, third membrane valve; 304, fourth membrane valve; 305, fifth membrane valve; 306, sixth membrane valve.

DETAILED DESCRIPTION OF THE EMBODIMENTS

To gain a better understanding of the purposes, structures and functions of the invention, an electrical impedance monitoring device, system and method for locomotion behaviors of *C. elegans* provided by the invention are described in further detail below in conjunction with accompanying drawings.

Figure 1:
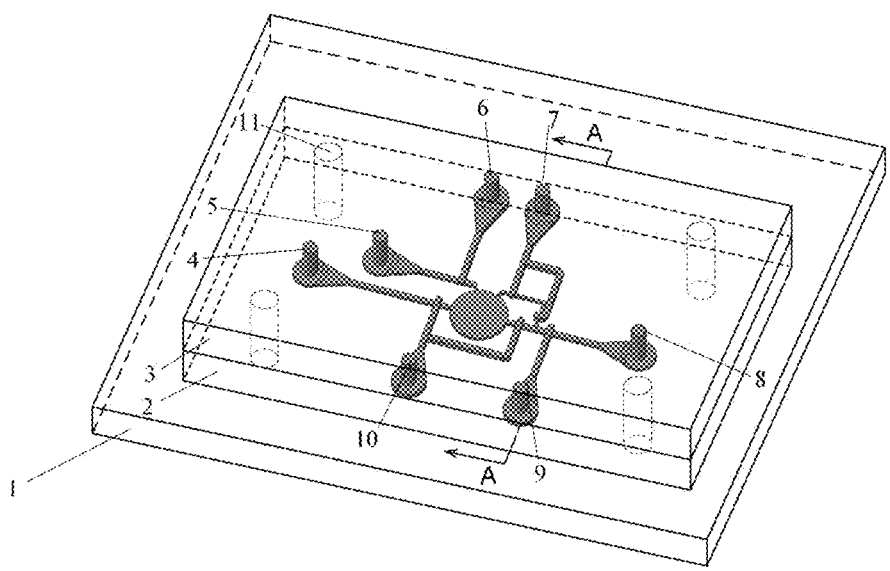
FIG. 1 is a schematic diagram of a monitoring device for locomotion behaviors of *C. elegans* according to the invention.
Figure 2:
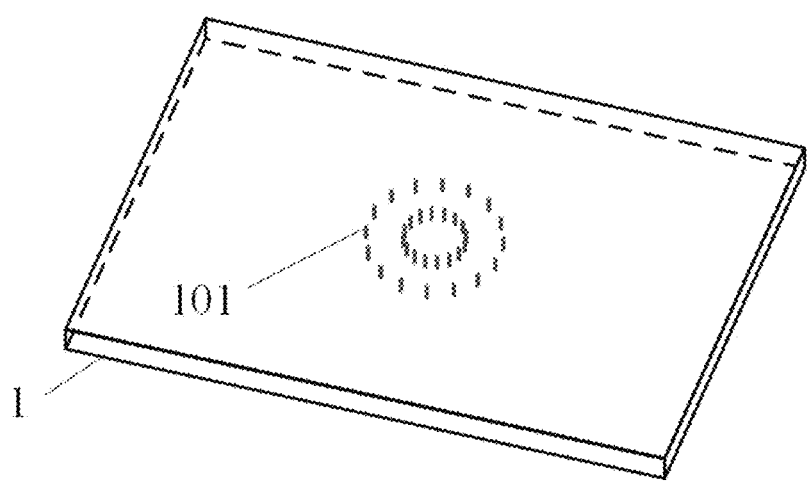
FIG. 2 is a schematic diagram of a circuit board and an electrode array according to the invention.
Figure 3:
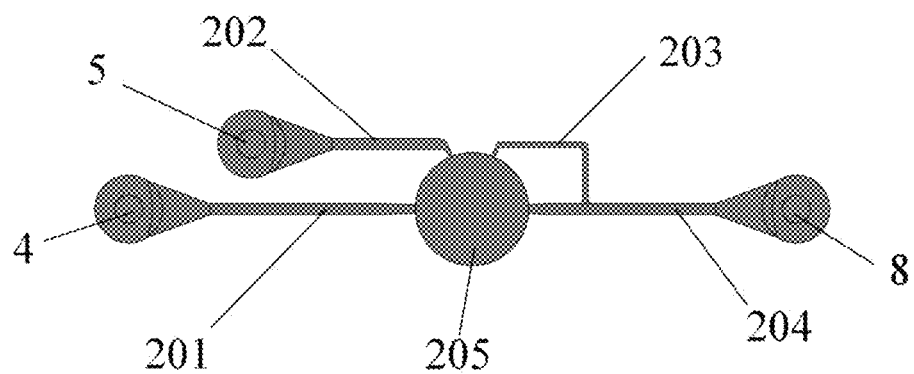
FIG. 3 is a schematic diagram of a microfluidic channel layer according to the invention.
Figure 4:
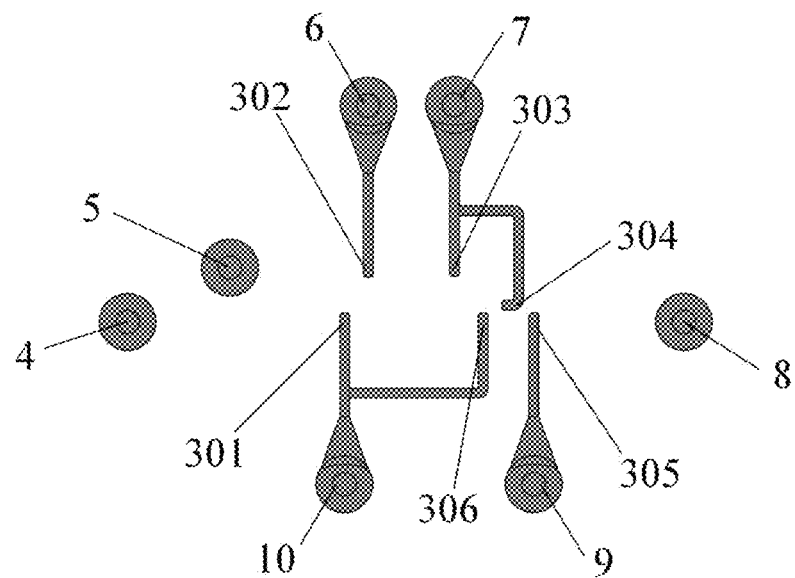
FIG. 4 is a schematic diagram of a gas channel layer according to the invention.
Figure 5:
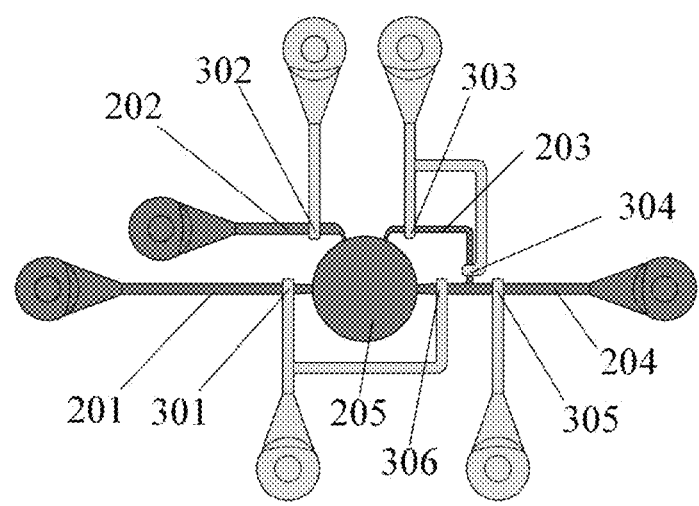
FIG. 5 is a schematic diagram of the combination of the microfluidic channel layer and the gas channel layer according to the invention.
Figure 6:
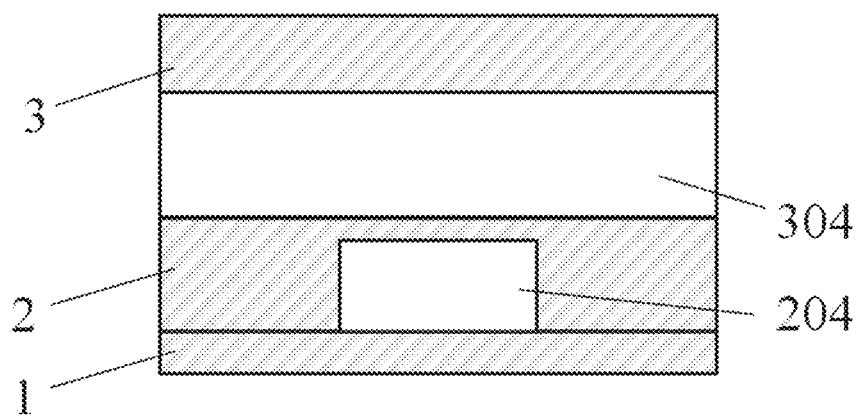
FIG. 6 is a schematic sectional view along A-A in FIG. 1.
Figure 7:
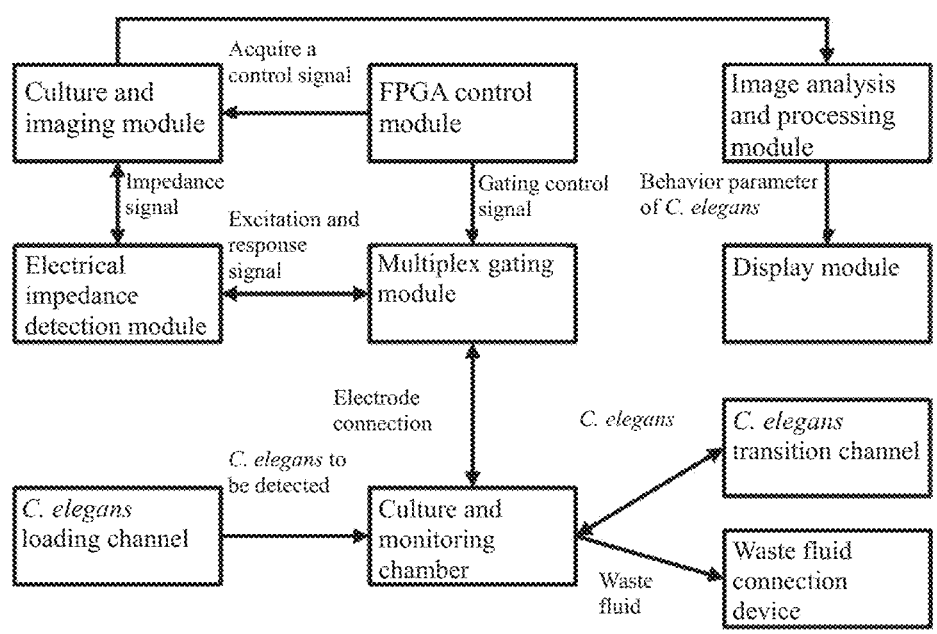
FIG. 7 is a schematic diagram of a monitoring method for locomotion behaviors of *C. elegans* according to the invention.

Refer to FIG. 1 and FIG. 7 which are schematic diagrams of an electrical impedance monitoring device, system and method for locomotion behaviors of *C. elegans* provided by the embodiments of the invention.

The invention provides an electrical impedance monitoring device for locomotion behaviors of *C. elegans*, comprising a circuit board 1, a microfluidic channel layer 2 and a gas channel layer 3, wherein:

The circuit board 1, as a substrate, is a printed circuit board made from an FR-4 board and is used for carrying a double-layer structure formed by bonding the microfluidic channel layer 2 and the gas channel layer 3.

The circuit board 1 is provided with through-holes distributed in two concentric circles and is connected to an electrode array 101, and each circle comprises 16 through-holes; wherein, the radius of an inner circle is half of the radius of an outer circle, such that the imaging precision of the center of a region is improved during EIT scanning.

The electrode array 101 comprises 32 electrodes which are gold-plated probes and is connected to the circuit board I by soldering, and the probes extend out of the circuit board 1 by a same height; wherein, soldering points of the probes are arranged on a back side of the circuit board 1, and a solder pad and solder holes on a front side of the circuit board I are filled with epoxy glue.

The microfluidic channel layer 2 and the gas channel layer 3 are made from polydimethylsiloxane (PDMS) and are formed by curing and molding on a mold with a microstructure comprising the microfluidic channel layer 2 and the gas channel layer 3, wherein the mold is a male mold and may be obtained by lithography on a silicon wafer with an SU-8 photoresist, etching of a silicon wafer, or 3D printing of a microstructure.

A PDMS structure formed by molding of the microfluidic channel layer 2 and the gas channel layer 3 is subjected to surface modification with oxygen plasma; then, an upper surface of the microfluidic channel layer 2 and a lower surface of the gas channel layer 3 are aligned and pressed to realize high-strength bonding; and during the alignment process, it should be guaranteed that a gas channel in the gas channel layer 3 are located above the corresponding channel in the microfluidic channel layer 2.

The circuit board 1, the microfluidic channel layer 2 and the gas channel layer 3 comprise four screw holes 11, and nylon screws are screwed into the screw holes 11 to tightly fix the double-layer structure formed by bonding the microfluidic channel layer 2 and the gas channel layer 3 to the circuit board 1.

The microfluidic channel layer 2 is used for culturing and monitoring *C. elegans* and comprises a fluid inlet 4, a food loading channel inlet 5, a *C. elegans* loading channel 201, a culture and monitoring chamber 205, a *C. elegans* transition channel 203, a food loading channel 202, an impurity discharge channel 204 and a fluid outlet 8.

The center of the culture and monitoring chamber 205 is located above the electrode array 101, the radius of the culture and monitoring chamber 205 is slightly greater than the radius of the outer circle of the electrode array 101, the height of the culture and monitoring chamber 205 is greater than the height of the electrode array 101 extending out of the circuit board 1, and after the electrical impedance monitoring device is installed, the electrode array 101 is located inside the culture and monitoring chamber 205.

The fluid inlet 4, the *C. elegans* loading channel 201, the culture and monitoring chamber 205, the impurity discharge channel 204 and the fluid outlet 8 are connected in sequence to realize loading of *C. elegans* and discharge of impurities.

The *C. elegans* transition channel 203 is arranged at an outlet of the culture and monitoring chamber 205 and returns to the culture and monitoring chamber 205, and *C. elegans* enters the *C. elegans* transition channel 203 from the culture and monitoring chamber 205 under the control of a third membrane valve 303, a fourth membrane valve 304, a fifth membrane valve 305 and a sixth membrane valve 306, and then returns to the culture and monitoring chamber 205.

The food loading channel 202 is connected to the culture and monitoring chamber 205 and is controlled by a second membrane valve 302 to be opened or closed to provide food for *C. elegans* in the culture and monitoring chamber 205.

The gas channel layer 3 comprises the fluid inlet 4, the food loading channel inlet 5, a first gas inlet 6, a second gas inlet 7, a third gas inlet 9, a fourth gas inlet 10, a first membrane valve 301, the second membrane valve 302, the third membrane valve 303, the fourth membrane valve 304, the fifth membrane valve 305, the sixth membrane valve 306 and the fluid outlet 8. Wherein, the first gas inlet 6, the second gas inlet 7, the third gas inlet 9 and the fourth gas inlet 10 are used for providing a gas pressure for the first membrane valve 301, the second membrane valve 302, the third membrane valve 303, the fourth membrane valve 304, the fifth membrane valve 305 and the sixth membrane valve 306, and when the gas pressure increases, the membrane valves will squeeze an upper wall of the microfluidic channel layer 2 to control the *C. elegans* transition channel 203 to be opened or closed.

The invention provides an electrical impedance monitoring system for locomotion behaviors of *C. elegans*, comprising a multiplex gating module, an FPGA control module, an electrical impedance detection module, an acquisition and imaging module, an image analysis and processing module and a display module. Wherein:

The multiplex gating module is connected to the electrode array 101 on the circuit board 1 and selects different electrodes as excitation and response electrodes for EIT scanning according to control signals generated by the FPGA control module.

The electrical impedance detection module is used for generating an excitation signal for EIT scanning and acquiring a response voltage of the response electrode.

The acquisition and imaging module is used for reading a detection result of the electrical impedance detection module and reconstructing an electrical impedance image of *C. elegans* according to the detection result.

The image analysis and processing module is used for processing the electrical impedance image of the *C. elegans* and calculating locomotion behavior parameters of the *C. elegans* such as the motion speed.

The display module is used for displaying a calculation result of the image processing module to realize real-time monitoring of locomotion behaviors of the *C. elegans*.

The invention provides an electrical impedance monitoring method for locomotion behaviors of *C. elegans*. The specific process of the electrical impedance monitoring method for locomotion behaviors of *C. elegans* is explained below with reference to a specific embodiment.

A pressure is applied to the first gas inlet 6 and the second gas inlet 7 to close the second membrane valve 302, the third membrane valve 303 and the fourth membrane valve 304; the first membrane valve 301, the fifth membrane valve 305 and the sixth membrane valve 306 are kept open to load *C. elegans* and a culture solution.

The *C. elegans* and the culture solution are fed via the fluid inlet 4 and pass through the *C. elegans* loading channel 201 to reach the culture and monitoring chamber 205, and the *C. elegans* stays in the culture and monitoring chamber 205 to be cultured.

The pressure applied to the first gas inlet 6 is released, and the second membrane valve 302 is opened to load *C. elegans* food.

The culture solution dissolved with *Escherichia coli* is fed via the food loading channel inlet 5 and enters the culture and monitoring chamber 205 through the food loading channel 202 to guarantee normal growth and development of the *C. elegans* in the culture and monitoring chamber.

Before EIT scanning, the second membrane valve 302 and the fifth membrane valve 305 are closed, the first membrane valve 301, the third membrane valve 303, the fourth membrane valve 304 and the sixth membrane valve 306 are opened, and fluid is fed continuously via the fluid inlet 4 to allow the *C. elegans* to enter the *C. elegans* transition channel 203.

After the *C. elegans* reaches the *C. elegans* transition channel 203, the third membrane valve 303 and the fourth membrane valve 304 are closed to allow the *C. elegans* to stay in the *C. elegans* transition channel 203; the fifth membrane valve 305 is opened, and the fluid is continuously fed via the fluid inlet 4 to clean the *C. elegans* culture and monitoring chamber, and generated waste fluid is discharged via the fluid outlet 8.

After being cleaned, the *C. elegans* culture and monitoring chamber 205 is detected by means of the electrodes in the inner and outer circles of the electrode array 101 to obtain an EIT scanning result of the *C. elegans* culture and monitoring chamber 205 without the *C. elegans*.

After the *C. elegans* culture and monitoring chamber 205 without the *C. elegans* is detected, the third membrane valve 303 and the fourth membrane valve 304 are opened, the fifth membrane valve 305 is closed, and the fluid is continuously fed via the fluid inlet 4 to allow the *C. elegans* to enter the culture and monitoring chamber 205 again.

After the *C. elegans* enters the culture and monitoring chamber 205, the first membrane valve 301 and the sixth membrane valve 306 are closed, EIT scanning is performed on the culture and monitoring chamber 205 repeatedly by means of the electrodes in the inner and outer circles of the electrode array 101, and each scanning result is read into the acquisition and imaging module.

After one round of *C. elegans* scanning is completed, the second membrane valve 302 is opened, and the culture solution dissolved with *Escherichia coli* is fed into the culture and monitoring chamber 205 via the food loading channel inlet 5 to culture *C. elegans* again for next measurement.

The EIT scanning results of the culture and monitoring chamber are read into the acquisition and imaging module by means of the electrical impedance detection module and are subjected to differential imaging with the EIT scanning result of the *C. elegans* culture and monitoring chamber 205 without the *C. elegans*, an electrical impedance image of the change of conductivity in the culture and monitoring chamber before and after the *C. elegans* are fed is reflected by means of an imaging result of the electrodes on the outer circle of the electrode array 101, and an electrical impedance image of a central area of the culture and monitoring chamber is obtained by means of an imaging result of the electrodes on the inner circle of the electrode array 101.

The image analysis and processing module reads the electrical impedance images of the electrodes in the inner and outer circles generated by the acquisition and imaging module, the imaging precision of the central area of the culture and monitoring chamber is improved by means of the imaging result of the electrodes on the inner circle, and then the images are further processed to calculate locomotion behavior parameters of the *C. elegans*.

The display module displays in real time the locomotion behavior parameters of the *C. elegans* calculated by the image analysis and processing module.

It can be understood that although the invention has been described with reference to some embodiments, those skilled in the art can make various modifications or equivalent substitutions to the features and embodiments described above without departing from the spirit and scope of the invention. In addition, under the enlightenment of the invention, these features and embodiments can be modified to adapt to specific conditions and materials without departing from the spirit and scope of the invention. Therefore, the invention is not limited to the specific embodiments disclosed here, and all embodiments falling within the scope of the claims of the application should fall within the protection scope of the invention.

The invention claimed is:

1. An electrical impedance monitoring device for locomotion behaviors of *C. elegans*, comprising a circuit board, a microfluidic channel layer and a gas channel layer, wherein the microfluidic channel layer and the gas channel layer form a double-layer structure fixed to the circuit board;

the circuit board, as a substrate of the electrical impedance monitoring device, is used for carrying the double-layer structure formed by bonding of the microfluidic channel layer and the gas channel layer; an electrode array is arranged on the circuit board and used for realizing current excitation and electrical impedance monitoring:

the microfluidic channel layer comprises a fluid inlet, a food loading channel inlet, a *C. elegans* loading channel, a culture and monitoring chamber, a *C. elegans* transition channel, a food loading channel, an impurity discharge channel and a fluid outlet, wherein the fluid inlet, the *C. elegans* loading channel, the culture and monitoring chamber, the impurity discharge channel and the fluid outlet are connected in sequence;

the gas channel layer comprises the fluid inlet, the food loading channel inlet, a first gas inlet, a second gas inlet, a third gas inlet, a fourth gas inlet, a first membrane valve, a second membrane valve, a third membrane valve, a fourth membrane valve, a fifth membrane valve, a sixth membrane valve and the fluid outlet; wherein, the first gas inlet, the second gas inlet, the third gas inlet and the fourth gas inlet are used for providing a gas pressure for the first membrane valve, the second membrane valve, the third membrane valve, the fourth membrane valve, the fifth membrane valve and the sixth membrane valve, and when the gas pressure increases, the membrane valves will squeeze an upper wall of the microfluidic channel layer to control the microfluidic channel layer to be opened or closed;

the food loading channel is connected to the culture and monitoring chamber and is controlled by the second membrane valve to be opened or closed; the *C. elegans* transition channel is arranged an outlet of the culture and monitoring chamber and returns to the culture and monitoring chamber, and *C. elegans* enters the *C. elegans* transition channel from the culture and monitoring chamber under the control of fluid, the third membrane valve, the fourth membrane valve, the fifth membrane valve and the sixth membrane valve, and then returns to the culture and monitoring chamber.

2. The electrical impedance monitoring device for locomotion behaviors of *C. elegans* according to claim 1, wherein the microfluidic channel layer and the gas channel layer are made from polydimethylsiloxane by molding and form the double-layer structure by bonding, and the double-layer structure is fixed to the circuit board with nylon screws.

3. The electrical impedance monitoring device for locomotion behaviors of *C. elegans* according to claim 1, wherein the electrode array comprises 32 gold-plated electrode probes and is electrically connected to a solder pad on a back side of the circuit board by soldering, all the gold-pated electrode probes extend out of the circuit board by a same height, and a solder pad and solder holes on a front side of the circuit board are filled and sealed with epoxy resin; and the electrode array is configured as a concentric circle structure, 16 electrodes are arranged on each of an inner circle and an outer circle of the electrode array, the electrodes on the outer circle are used for scan imaging of the culture and monitoring chamber, and the electrodes on the inner circle are used for scan imaging of a central area of the culture and monitoring chamber.

4. The electrical impedance monitoring device for locomotion behaviors of *C. elegans* according to claim 3, wherein the culture and monitoring chamber is circular, a center of the culture and monitoring chamber is located above a center of the electrode array, a radius of the culture and monitoring chamber is slightly greater than a radius of the outer circle of the electrode array, and after the electrical impedance monitoring device is installed, the electrode array is located inside the culture and monitoring chamber.

5. A system based on the electrical impedance monitoring device for locomotion behaviors of *C. elegans* according to claim 1, comprising a multiplex gating module, an FPGA control module, an electrical impedance detection module, an acquisition and imaging module, an image analysis and processing module and a display module, wherein the multiplex gating module is connected to the electrode array on the circuit board and selects different electrodes as excitation and response electrodes for EIT scanning according to control signals generated by the FPGA control module; the electrical impedance detection module is used for generating an excitation signal for EIT scanning and acquiring a response voltage of the response electrode; the acquisition and imaging module is used for reading a detection result of the electrical impedance detection module and reconstructing an electrical impedance image of *C. elegans* according to the detection result; the image analysis and processing module is used for processing the electrical impedance image of the *C. elegans*, compensating for imaging precision of a central area of the electrical impedance image according to an imaging result of electrodes on an inner circle of the electrode array and calculating locomotion behavior parameters of the *C. elegans*, including a motion speed and the like; and the display module is used for displaying a calculation result of the image analysis and processing module to realize real-time monitoring of locomotion behaviors of the *C. elegans*.

6. An electrical impedance monitoring method for locomotion behaviors of *C. elegans*, being implemented based on the system in claim 5 and comprising the following steps: allowing the *C. elegans* to enter the culture and monitoring chamber via a fluid inlet and the *C. elegans* loading channel and enter the *C. elegans* transition channel under the control of the membrane valves; cleaning the culture and monitoring chamber through the fluid inlet and the *C. elegans* loading channel; detecting the *C. elegans* culture and monitoring chamber without *C. elegans* by means of the FPGA control module, the multiplex gating module and the electrical impedance detection module; allowing the *C. elegans* to enter the *C. elegans* culture and monitoring chamber again, and performing EIT scanning repeatedly; recording scanning results by the acquisition and imaging module, and generating electrical impedance images of the *C. elegans* in real time according to the scanning results; and calculating locomotion behavior parameters of the *C. elegans* by the image analysis and processing module according to continuous electrical impedance images of the *C. elegans*, and performing real-time display by the display module.

7. The system according to claim 5, wherein the microfluidic channel layer and the gas channel layer are made from polydimethylsiloxane by molding and form the double-layer structure by bonding, and the double-layer structure is fixed to the circuit board with nylon screws.

8. The system according to claim 5, wherein the electrode array comprises 32 gold-plated electrode probes and is electrically connected to a solder pad on a back side of the circuit board by soldering, all the gold-pated electrode probes extend out of the circuit board by a same height, and a solder pad and solder holes on a front side of the circuit board are filled and sealed with epoxy resin; and the electrode array is configured as a concentric circle structure, 16 electrodes are arranged on each of an inner circle and an outer circle of the electrode array, the electrodes on the outer circle are used for scan imaging of the culture and monitoring chamber, and the electrodes on the inner circle are used for scan imaging of a central area of the culture and monitoring chamber.

9. The system according to claim 8, wherein the culture and monitoring chamber is circular, a center of the culture and monitoring chamber is located above a center of the electrode array, a radius of the culture and monitoring chamber is slightly greater than a radius of the outer circle of the electrode array, and after the electrical impedance monitoring device is installed, the electrode array is located inside the culture and monitoring chamber.

\* \* \* \* \*